United States Patent

Straemke

[11] Patent Number: 5,972,160
[45] Date of Patent: Oct. 26, 1999

[54] PLASMA REACTOR

[76] Inventor: Siegfried Straemke, Fichtenhain 6, 52538 Selfkant, Germany

[21] Appl. No.: 08/771,697

[22] Filed: Dec. 23, 1996

[30] Foreign Application Priority Data

Jan. 20, 1996 [DE] Germany ............... 296 00 991 U

[51] Int. Cl.[6] ................................. B01J 19/08
[52] U.S. Cl. ............... 156/345; 118/718; 118/723 R; 118/730; 242/364.12; 242/364.2; 242/366.1
[58] Field of Search ............... 118/718, 730, 118/723 E, 723 R; 156/345; 204/298.24; 242/364.12, 364.2, 366.1

[56] References Cited

U.S. PATENT DOCUMENTS

| 2,155,324 | 4/1939 | Moritz | 264/195 |
|---|---|---|---|
| 2,267,402 | 12/1941 | Helm | 242/364.12 |
| 2,532,562 | 12/1950 | Lorig | 219/469 |
| 2,567,233 | 11/1951 | Lorig | 242/364.11 |
| 2,614,313 | 10/1952 | Reitsma | 242/366.2 |
| 2,622,860 | 12/1952 | Lorig | 266/103 |
| 2,658,256 | 11/1953 | Van Dijck | 242/364.11 |
| 2,963,233 | 12/1960 | Riegler | 242/364.11 |
| 3,709,444 | 1/1973 | Tannert | 242/366 |
| 3,883,960 | 5/1975 | Stang | 34/625 |
| 3,884,787 | 5/1975 | Kuehnle | 204/192.12 |
| 3,959,104 | 5/1976 | Fales | 204/164 |
| 4,013,539 | 3/1977 | Kuehnle | 204/298.24 |
| 4,065,101 | 12/1977 | Korbut | 254/295 |
| 4,437,324 | 3/1984 | Sando et al. | 68/5 E |
| 4,457,145 | 7/1984 | Sando et al. | 68/5 E |
| 4,728,406 | 3/1988 | Banerjee et al. | 204/192.29 |
| 4,957,061 | 9/1990 | Ando et al. | 118/719 |
| 5,439,736 | 8/1995 | Nomura | 428/308.4 |
| 5,462,602 | 10/1995 | Misiano et al. | 118/718 |
| 5,499,774 | 3/1996 | Novak et al. | 242/364.2 |
| 5,595,792 | 1/1997 | Kashiwaya et al. | 427/570 |

*Primary Examiner*—Bruce Breneman
*Assistant Examiner*—Allan Olsen
*Attorney, Agent, or Firm*—Diller, Ramik & Wight, PC

[57] ABSTRACT

The invention relates to a plasma reactor for flexible strand material (12), comprising passages (20,22) for the strand material (12) to enter into and exit from the reactor chamber (16), electrodes (54,56,58,60) arranged in the reactor chamber (16) for generating a plasma, and at least one guiding element arranged in the reactor chamber (16) and being adapted to guide the strand material (12) along a processing path. In order to provide a compact plasma reactor (10) for flexible strand material (12) which permits a uniform and gentle processing of the flexible strand material (12), it is provided, according to the invention, that at least one guiding element is a roller (24,26) about which the strand material (12) revolves in several windings axially offset with respect to each other, and that the electrodes (54,56,58,60) are arranged such that the plasma generated by them simultaneously acts on portions (62) of at least two windings axially offset with respect to each other.

9 Claims, 2 Drawing Sheets

PLASMA REACTOR

BACKGROUND OF THE INVENTION

The present invention relates to a plasma reactor for flexible strand material.

Flexible strand materials, e.g., wires, irregular fiber bundles such as, e.g., sliver combings of natural wool, or regular fiber knits and fiber braidings, e.g., technical textiles, are used as raw materials and intermediate products in many branches of industry. To prepare such strand materials for the subsequent processing step, chemical treatment methods are frequently used by means of which the surface of the strand material is modified. Since chemical treatment methods often involve considerable environmental impairments, attempts have been made to subject the mentioned strand materials to a plasma treatment (PVD, CVD, plasma etching) which results in a lower environmental impact as compared to chemical processing methods.

To be able to subject flexible strand materials to a continuous plasma treatment, plasma reactors have been developed as pilot plants, comprising a reactor chamber into which the strand material is guided via an entrance passage and out of which it is guided via an exit passage. Electrodes are arranged in the interior of the reactor chamber, generating a plasma through which the strand material is moved.

To be able to achieve a good result with the plasma treatment, it is required that the strand material to be processed is exposed to the influence of the plasma for several minutes. Such a long processing time can be achieved when the strand material is guided on a meander-shaped path in the interior of the plasma reactor. With known plasma reactors, the guidance is effected by guiding elements guiding the strand material along a processing path. In spite of such a guidance, the known plasma reactors are very elongated apparatus in which a plurality of serially connected electrodes is provided each of which generates small, local plasmas. The plurality of electrodes, however, are difficult to control and there is the danger of a local thermal destruction of the strand material to be processed. Moreover, the guiding elements guiding the strand material have a negative effect upon the development of the plasma and the control thereof.

Apart from the disadvantage of a great structural length and a strand guidance susceptible to errors, the known plasma reactors thus also have the disadvantage of an insufficient controllability and an insufficient processing quality.

SUMMARY OF THE INVENTION

It is the object of the present invention to provide a compact plasma reactor for flexible strand material, which permits a uniform and gentle processing of the flexible strand material.

According to the invention, it is provided that at least one guiding element is a roller about which the strand material revolves in several windings axially offset with respect to each other. The plasma sources are arranged such that the plasma generated thereby simultaneously acts on portions of at least two windings axially offset with respect to each other. Due to the fact that the strand material runs several times around the same roller, a long processing path is provided in the interior of the reactor chamber, its length several times surpassing the length of the plasma reactor. The long processing path permits long processing times with a compact type of construction of the plasma reactor.

Because of the fact that the strand material runs several times around the same roller, at least two strand material sections lie beside each other at the same time in such a manner that they can be processed by the plasma of one plasma source. The plasma sources, preferably electrodes, are appropriately designed and arranged and generate a spacious plasma which is used for the simultaneous processing of several strand material sections. Due to its size, the spacious plasma is easier to control compared with a plasma the extension of which lies only in the region of the order of magnitude of the width or thickness of the strand material. Due to the fact that the strand material runs around several times, it is also particularly well accessible. A plasma processing the strand material is not disturbed in its development by installations or the like.

When the electrodes are arranged in the region of free transport paths, the plasma thereof can envelop the strand material by sections and process it particularly uniformly. Moreover, with such a configuration, the development of the plasma is not even impaired by the rollers. As a substantial disturbance variable for the adjustment of the plasma, only the quality of the strand material remains to be considered. The same advantages also result from a plasma generated without electrodes, e.g., from a microwave plasma.

If only one roller is arranged in the plasma reactor, it is advantageous to let the strand material freely depend from the roller. It is also possible, however, to provide reversing elements cooperating with the roller, so that the strand material is guided in a quasi stretched manner between the roller and the reversing elements.

The processing of fibrous materials with a low tensile strength poses a particular problem. Such a material is, e.g., sliver combing of sheep wool which has to be processed prior to spinning so that scales formed on the individual fibers of the sliver combing are removed. The removal of the scales serves to avoid pilling and felting. Due to their low tensile strength, fibrous materials are only allowed to be subjected to tensile load to a limited degree. Over longer distances, tensile forces are quasi non-transferable. The shorter the fiber length, the lower is the tensile strength. The invention is also concerned with the facilitation of the plasma processing of fibrous materials.

Through the utilization of at least one roller constructed in accordance with the invention, controlled movement or transport of material is effected parallel to the roller axis. For the movement transversely to the orientation of the windings, only small forces have to be applied. Therefore, it is also possible to process fibrous materials such as, e.g., sliver combing of sheep wool, with the plasma reactor according to the invention.

In case of a strand material with low tensile strength, the longitudinal forces required for the material transport in longitudinal direction of the strand material are preferably transferred to the strand material by arranging at least two rollers which are rotatingly driven so that forces acting in the direction of the axis of the strand material are applied so as to be distributed almost over the entire length of the strand material. Moreover, no longitudinally acting frictional forces are to be overcome in case of such a configuration for the material transport in longitudinal direction of the strand material. Then, the holding and transport forces required in total are small so that the longitudinal tensions in the interior of the strand material are low as well.

If at least two rollers with parallel axes are arranged in the interior of the reactor chamber of the plasma reactor, it is possible to meet the desired strand material transport conditions in the region of free transport paths between the rollers particularly well. Moreover, with the arrangement of two rollers, it is particularly simple to generate a plasma uniformly processing the strand material over its entire circumference. Electrodes or plasma sources located in the interior of the windings of the strand material can generate a particularly effective plasma penetrating the plane of the strand material.

Preferably, the material transport effected in axial direction of the rollers is performed in that at least one displacement element per roller is provided. The displacement elements, whose displacement movement is preferably effected in dependence on the rotational position of the rollers, permit a transverse transport of the strand material along the roller axes without sliding movements causing friction on the strand material transverse to the longitudinal extension thereof occurring. Fibrous strand material in particular, whose tear strength is low, can be processed with such a configuration.

In a forced guidance by means of displacement elements of a particularly preferred embodiment, several elongated displacement elements are arranged parallel to each other and to the axes of the rollers at each of the rollers and together describe substantially the contour of a cylinder and are cyclically lowerable through a lifting gear. Owing to the cyclical lowering of the displacement elements, the strand material can be transported very uniformly in small steps in axial direction of the rollers without the material experiencing a sliding movement on one of the rollers. Thereby, a wear of the rollers due to friction is avoided as well as the danger of tearing the strand material during the material transport.

Preferably, the lifting gear comprises a stationary swash plate on which the displacement elements are rotated uprightly about the rotational axis of the respective roller. The swash plate represents a particularly simple and reliable gear type. If the inclination of the swash plate with respect to the rotational axis of the respective roller is adjustable, the material transport performed in the axial direction can be adjusted per revolution of the strand material. It is also possible to separately drive the guidances, e.g., via magnets and the like.

If there are no displacement elements, the material transport in the axial direction of the rollers can be effected in that the strand material being wound on the rollers displaces previously wound-on strand material in axial direction. To support such a material transport, the rollers preferably have a frustoconical configuration so that the support of the windings of the strand material is lower towards the delivery end of the roller. If the tapered side of the rollers is oriented downward in the reactor chamber, the material transport is additionally supported by the gravity acting upon the strand material.

BRIEF DESCRIPTION OF THE DRAWINGS

Further advantageous embodiments and developments of the invention result from the dependent claims as well as the drawings in conjunction with the description relating to particularly preferred embodiments.

In the Figures.

DESCRIPTION OF THE PREFERRED EMBODIMENTS

Figure 1:
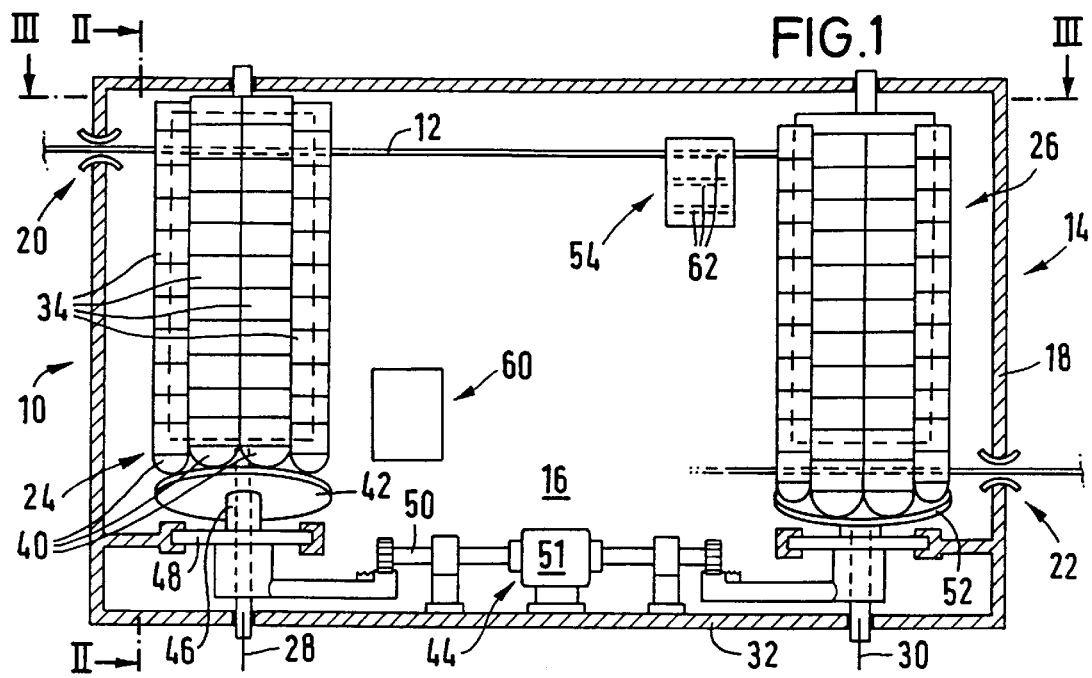
FIG. 1 shows a plasma reactor according to a first embodiment of the invention in longitudinal section.

The plasma reactor 10 for flexible strand material 12 shown in FIG. 1 comprises a reactor chamber 16 for the plasma processing which is arranged in the interior of a container 14. At its one end face, a box-shaped rigid container wall 18 of the container 14 is provided with a passage 20 for the strand material 12 to enter into the reactor chamber 16, and at its other end face, it is provided with a passage 22 for the strand material 12 to exit from the reactor chamber 16.

A first roller 24 and a second roller 26 are arranged as guiding elements for the strand material 12 in the interior of the container 14. The rollers 24,26 comprise parallel rotational axes 28,30 which are spaced from each other and extend vertically to a bottom wall 32 of the container 14. Each of the rollers 24,26 comprises eight displacement elements 34, which are elongated rod-shaped strips rotating with the corresponding roller.

The displacement elements 34 of the first roller 24 are guided on a first basic body 36 so as to be displaceable towards the rotational axis. Externally, the displacement elements are each provided with a carrier surface 38 for the strand material 12, which either exactly follows the course of the cylinder jacket surface of the roller 24 or has an outwardly directed bulging of strong curvature. Each displacement element 34 stands, with a spherical base 40, upon a swash plate 42 which is tiltable and arranged in the reactor chamber 16 so as to be secured against rotation. The displacement elements 34 of the first roller 24 are rotatingly driven by the basic body 36 in the direction of arrow A so that they are lowered and lifted again during one revolution about the rotational axis 28. Hence, the swash plate 42, together with the basic body 36 and the displacement elements 34, forms a lifting gear.

To adjust the path which the displacement elements 34 travel towards the rotational axis 28, an adjusting mechanism 44 is provided, comprising a rotary disc 48 carrying an eccentrically arranged cam 46. Via a driving linkage 50 driven by a motor 52, the rotary disc 48 is rotatable such that the cam 46 travels about the rotational axis 28 of the first roller 24 and unilaterally lifts or lowers the swash plate 42 while doing so.

The structure of the second roller 26 corresponds to that of the first roller 24. It differs from the first roller 24 only in that the inclination of the swash plate 52 of the second roller 26 is opposite to the inclination of the swash plate 42 of the first roller 24 with respect to the rotational axes 28,30.

The strand material 12 processed in the reactor chamber 16 moves from the passage 20 past the first roller 24 to the second roller 26. At the second roller 26, the strand material initially engages on a displacement element 34 which is in its utmost lift position. The strand material winds round the second roller 26 with a looping angle of 180°, engaging on three or four further displacement elements 34 in dependence on the rotational position of the roller 26. From the second roller 26, the strand material returns to the first roller 24 where it engages on a displacement element which is in its highest position. In the course of a 180° looping at the first roller 24, the strand material 12, depending on the rotational position of the roller 24, again engages on three or four displacement elements 34 which are each on a lower level than the previous displacement element at this roller 24. From the first roller 24, the flexible strand material 12 then moves to the second roller 26 again, the strand material repeatedly moving to and fro in mutually offset windings on its way from the entrance passage 20 to the exit passage 22.

Since the strand material encloses each of the two rollers 24,26 only at one side where the displacement elements 34 move downward on their way about the respective rotational axis 28,30, the strand material 12 is guided from the top passage 20 at the entrance side to the bottom passage 22 at the exit side. The displacement elements 34 substantially move upward in a region where no strand material 12 engages on them. The displacement elements 34 can also be operated in a horizontal position when they are forcedly guided. Then, the rollers may also be arranged above one another.

To be able to perform a plasma processing in the reactor chamber 16, the container 14 is connected to a vacuum source (not shown) generating a vacuum in the reactor chamber 16. Moreover, a gas inlet device (not shown) is provided by which inert gases and/or reaction gases can be guided into the reactor chamber. The gas inlet device and the suction source are arranged such that the plasma reactor is operable as a counterflow reactor, a transverse flow reactor and/or a crossflow reactor.

In order to generate several large-surface plasmas in the reactor chamber 16, several electrode pairs 54,56,58,60 are provided, the electrodes of the electrode pairs 54,56,58,60 being respectively spaced from each other such that the strand material 12 can be passed through between them. Each of the electrodes generates a plasma enclosing strand material sections 62 of several windings of the strand material 12 mutually offset in axial direction.

In axial direction of the rollers 24,26, the electrode pairs 54,56,58,60 are arranged at different heights. They are located between the rollers 24,26 in the region of free transport paths of the strand material 12, which means in regions where the strand material 12 is not supported. They are arranged both in that connection area of the rollers 24,26, in which the strand material moves from the first roller 24 to the second roller 26, and in that connection area in which the strand material moves from the second roller 26 to the first roller 24. The distance between the respective electrode pairs 54,56,58,60 arranged in descending order in axial direction of the rollers 24,26 is equal. Beside electrodes, other plasma sources, e.g., microwave sources, can generate the plasmas processing the strand material 12.

In order to process, e.g., sliver combing of sheep wool with the plasma reactor 10, the reactor is initially charged in a preparing step, the strand material being guided about the rollers 24,26 in mutually offset windings until the height difference between the passage 20 and the passage 22 is overcome. After the evacuation of the reactor chamber 16 and the setting of a desired gas atmosphere, one plasma, respectively, is ignited between the electrode pairs 54,56, 58,60 by means of a suitable current source. Through the passage 20, the strand material 12 is continuously guided into the reactor chamber 16, and it is continuously drawn out of it through the passage 22. The first and second rollers 24,26 are driven with a circumferential speed corresponding to the supply and discharge speed of the strand material 12.

Depending on the type of plasma processing, longer or shorter dwelling times of the strand material 12 in the plasma reactor 10 are required. With the circumferential speed of the rollers 24,26 given, the processing time can be set by the number of windings of the strand material 12 in the plasma reactor 10. If a small number of windings is required with a short processing time, the inclination of the swash plates 42,52 is increased by the motor 51. If a long processing time is desired, the strand material 12 is placed about the rollers 24,26 in numerous windings. In this case, the inclination of the swash plates 42,52 is reduced so that they almost extend vertically to the rotational axes 28,30.

In the processing of natural wool, the plasma reactor 10 primarily serves the degreasing and the removal of scales. It is also possible, however, to employ the plasma reactor 10 for the surface working of wire or plastics and synthetic fiber fabrics, e.g., for the plasma polymerization, for the activation of Kevlar fibers, for metallizing or for plasma etching.

Figure 4:
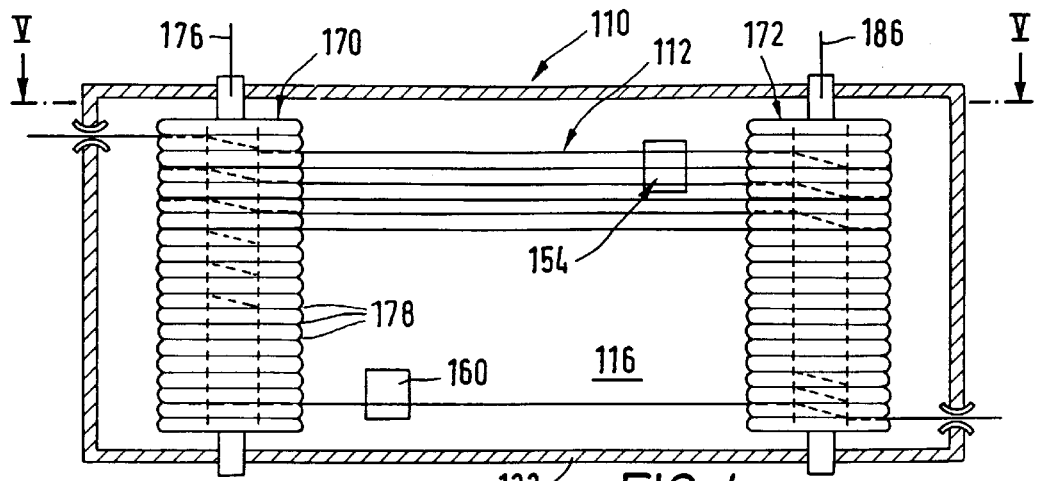
FIG. 4 shows a longitudinal section of a plasma reactor according to a second embodiment.
Figure 5:
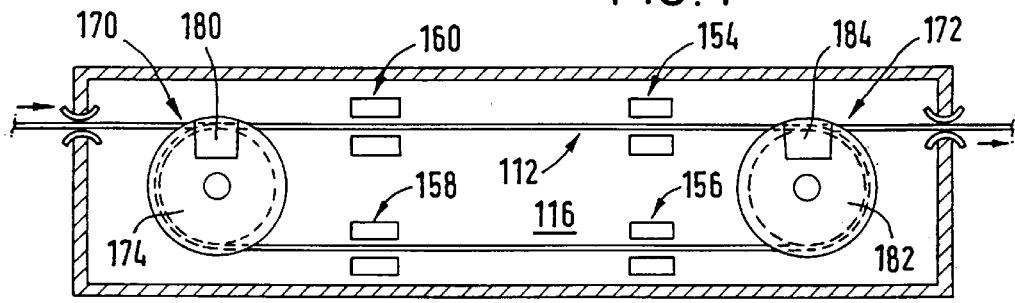
FIG. 5 is a sectional view of the plasma reactor of FIG. 4 taken along line V—V in FIG. 4.

The plasma reactor 110 according to the second embodiment in FIGS. 4 and 5 differs from the plasma reactor 10 according to the first embodiment only in the configuration of the first roller 170 and the second roller 172. Those parts of the plasma reactor 110 according to the second embodiment which correspond to parts of the plasma reactor 10 according to the first embodiment are designated with reference numerals increased by 100 with respect to the first embodiment.

The first roller 170 comprises a roller body 174 on whose substantially cylindrical outer surface a plurality of grooves 178 parallel to each other and concentric to the axis 176 of the roller body are formed. The strand material 112 is guided in the grooves 178. To transfer the strand material 112 from one groove 178 to a groove 178 located therebelow, a displacement strip 180 is embedded in the roller body 174, which co-rotates with the roller body 174 and displaces the strand material 112 in axial direction. The structure of the second roller 172 corresponds to that of the first roller 170, and the second roller comprises a displacement strip 184 embedded in a roller body 182. The two roller bodies 174,182 are rotated at an equal speed, the displacement strips 180,184 always assuming the same rotational position with respect to a plane connecting the axis 176 of the first roller 170 with the axis 186 of the second roller 172. As a function of the rotational position of the roller bodies 174,182, the two displacement strips 180,184 are axially moved at the same time, so that a coordinated strand material advancement is effected in the direction of the axes 176,186.

Figure 2:
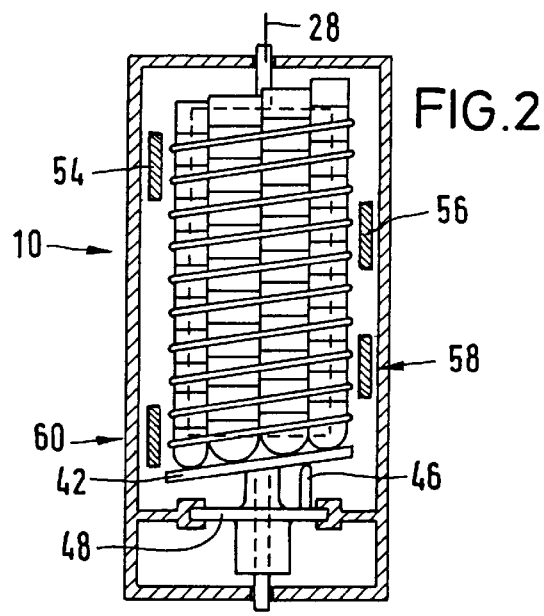
FIG. 2 is a sectional view of the plasma reactor of FIG. 1 taken along line II—II in FIG. 1.
Figure 3:
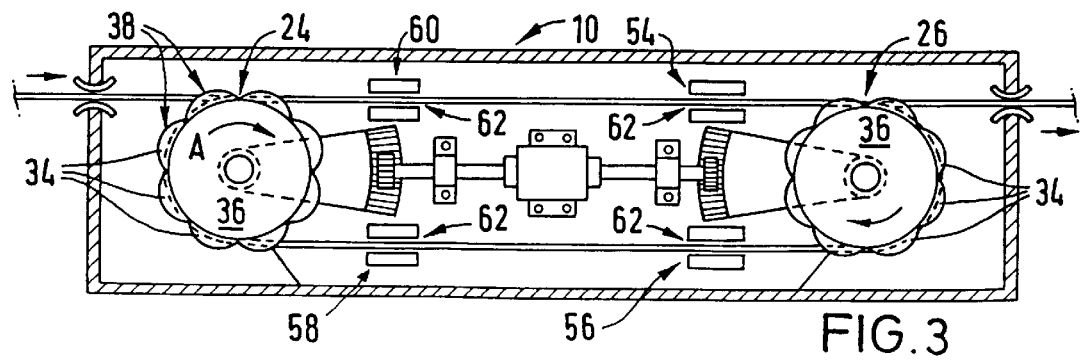
FIG. 3 is a sectional view of the plasma reactor of FIGS. 1 and 2 taken along lines III—III in FIG. 1.
Figure 6:
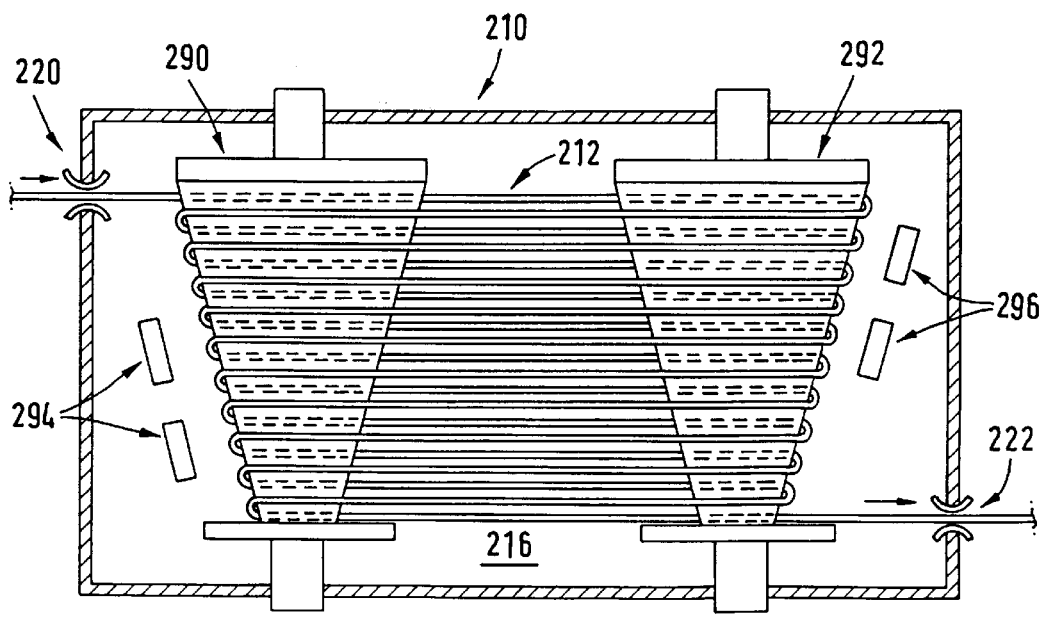
FIG. 6 shows a longitudinal section of a plasma reactor according to a third embodiment of the invention.

The plasma reactor 210 according to the third embodiment in FIG. 6 differs from the plasma reactor 10 according to the first embodiment in the configuration of the first and second rollers 290,292 and in the configuration of the electrode pairs 294,196. As to parts of the third embodiment which correspond to parts according to the first embodiment, reference is made to the description of FIGS. 1 to 3, reference numerals of corresponding parts being increased by 200 in the third embodiment.

The axis-parallel rollers 290,292 of the third embodiment according to FIG. 6 have a frustoconical configuration, the tapered side of each of the rollers 290,292 pointing towards the bottom wall 232. Preferably, the inclination angle of the rollers is preferably in the range of 0.2° to 5° and particularly in the range of 1° to 2°.

The two electrode pairs 294,296 are arranged in the looping region of the rollers 290,292 and generate a plasma processing the strand material 212 only at the outside thereof. The arrangement of the electrode pairs 294,296 in the looping region of the rollers 290,292, however, has the advantage that the strand material 212 is stretched in this region due to the deflection so that a good depth effect is achievable by the plasma.

What is claimed is:

1. A plasma reactor for flexible strand material (12) comprising passages (20, 22) for the strand material (12) to enter into and exit from a reactor chamber (16), plasma sources arranged in the reactor chamber (16) for generating a plasma, a guiding device arranged in the reactor chamber (16) and adapted to guide the strand material (12) along a processing path, the guiding device comprises at least two synchronously rotating rollers (24, 26; 170, 172) about each of which the strand material (12, 112) revolves in several windings which are axially offset with respect to each other, the plasma sources are arranged such that the generated plasma simultaneously acts on portions (62) of at least two windings spanning said two synchronously rotating rollers and axially offset with respect to each other, said synchronously rotating rollers (24, 26; 170, 172) being oriented with substantially parallel axes, each roller (24, 26; 170, 172) being provided with at least one displacement element (34; 180, 184); and the displacement elements (34; 180, 184) transport the strand material (12; 112) in the axial direction of the rollers (24, 26; 170, 172) in dependence on the rotational position of the rollers (24, 26; 170, 172).

2. The plasma reactor according to claim 1, wherein each of the rollers (24,26) includes several elongated displacement elements (34) parallel to each other and to the axes (28,30) of the rollers (24,26), and the displacement elements (34) of each roller (24,26) being cyclically lowerable via a lowering gear.

3. The plasma reactor according to claim 2, wherein the lowering gear comprises a stationary swash plate (42,52), and wherein the displacement elements (34) are co-rotated with the respective roller (24,26) while moving on the swash plate (49,52).

4. The plasma reactor according to claim 3, wherein the inclination of the swash plate (42,52) with respect to the rotational axis (28,30) of the respective roller (24,26) can be adjusted.

5. The plasma reactor according to claim 1, wherein the plasma sources are electrodes (54,56,58,60).

6. The plasma reactor according to claim 5, wherein the electrodes (54,56,58,60) are arranged between the rollers (24,26) in the region of free transport paths of the strand material (12) and generate, in pairs, a respective plasma between them through which the strand material (12) is passed.

7. The plasma reactor according to claim 1, wherein the plasma sources are high-frequency radiators.

8. The plasma reactor according to claim 1, wherein each of the rollers (170,172) comprise guiding grooves (178) arranged substantially parallel to each other and situated in planes vertical to the respective rotational axes (176,186) of the rollers (170,172), and wherein the displacement elements (180,184) transfer the strand material (112) from the plane of one guiding groove (178) into the plane of a guiding groove (178) situated therebelow.

9. The plasma reactor according to claim 1, wherein the reactor chamber (216) has at least two rollers (290;292) arranged therein which are of a frustoconical configuration and are oriented in the same direction in the reactor chamber (216), the strand material (212) coming from the entrance passage (220) being advanced to the frustoconical rollers (290,292) in the region of their greatest diameter and leaving the rollers (290,292) in the region of their smallest diameter.

* * * * *